(12) United States Patent
Bober

(10) Patent No.: US 9,830,408 B1
(45) Date of Patent: Nov. 28, 2017

(54) SYSTEM AND METHOD FOR EVALUATING THE PERFORMANCE OF A WEAPON SYSTEM

(71) Applicant: Tomas Bober, Budd Lake, NJ (US)

(72) Inventor: Tomas Bober, Budd Lake, NJ (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 941 days.

(21) Appl. No.: 13/688,732

(22) Filed: Nov. 29, 2012

(51) Int. Cl.
  *G06G 7/48* (2006.01)
  *G06F 17/50* (2006.01)

(52) U.S. Cl.
  CPC .................. *G06F 17/5009* (2013.01)

(58) Field of Classification Search
  CPC ... G06F 17/5009; G06F 17/18; G06F 17/5086
  USPC ......................................................... 703/2, 7
  See application file for complete search history.

(56) References Cited

U.S. PATENT DOCUMENTS

| | | | | |
|---|---|---|---|---|
| 4,490,719 A * | 12/1984 | Botwin | ................ | F41G 7/2226 342/188 |
| 5,375,792 A * | 12/1994 | Grau | ..................... | F42B 10/02 244/3.22 |
| 5,719,797 A * | 2/1998 | Sevachko | ........... | G06F 17/5009 700/3 |
| 6,598,534 B2 * | 7/2003 | Lloyd | ..................... | F41H 11/02 102/491 |
| 6,604,064 B1 * | 8/2003 | Wolff | ..................... | G09B 19/00 434/21 |
| 7,026,980 B1 * | 4/2006 | Mavroudakis | ........ | G01S 13/723 342/101 |
| 7,430,303 B2 * | 9/2008 | Sefcik | .................. | G06K 9/3241 348/94 |
| 7,605,747 B1 * | 10/2009 | Mookerjee | ............ | G01S 13/723 342/106 |
| 7,961,133 B2 * | 6/2011 | Vollin | ..................... | F41G 7/224 342/14 |

(Continued)

OTHER PUBLICATIONS

Matthias Knapp, NPL, "Concept for simulating engagement strategies for C-RAM systems using laser Weapons", Aug. 15, 2012(google).*

(Continued)

*Primary Examiner* — Omar Fernandez Rivas
*Assistant Examiner* — Iftekhar Khan
(74) *Attorney, Agent, or Firm* — John P. DiScala

(57) ABSTRACT

A system and method for evaluating the performance of a weapon platform by modeling, simulating, and analyzing all relative aspects of an engagement that would contribute to a fired projectile missing its intended impact point. The present system embodies various aspects as software objects and defines their dependencies and structure using a multi-node tree. The present system uses an imaged based approach to capture the lethality of ammunition, vulnerability of the targets, and results of an engagement scenario. Monte Carlo simulation is used to calculate the outcome statics and to display individual outcomes of the engagement to the user. The resulting product surpasses the capabilities and performance of conventional systems, protects proprietary information, and reduces the amount of time needed to analyze a weapon system.

7 Claims, 17 Drawing Sheets

(56) References Cited

U.S. PATENT DOCUMENTS

| | | | | |
|---|---|---|---|---|
| 8,005,612 B2* | 8/2011 | Asahara | G01C 21/32 340/988 |
| 8,138,960 B2* | 3/2012 | Nonaka | G01C 21/32 342/25 A |
| 8,270,730 B2* | 9/2012 | Watson | G06K 9/00214 382/103 |
| 8,285,528 B1* | 10/2012 | Szymanski | F42B 35/00 703/6 |
| 8,336,776 B2* | 12/2012 | Horvath | F41G 1/38 235/400 |
| 8,353,454 B2* | 1/2013 | Sammut | F41G 1/38 235/404 |
| 8,563,908 B1* | 10/2013 | Lew | G06K 9/629 244/3.1 |
| 8,675,183 B1* | 3/2014 | Jaklitsch | F41F 3/045 356/20 |
| 2002/0045999 A1* | 4/2002 | Bollweg | F41G 3/2683 702/158 |
| 2002/0192622 A1* | 12/2002 | Perry | F41G 7/006 434/16 |
| 2002/0197584 A1* | 12/2002 | Kendir | F41G 3/2655 434/21 |
| 2006/0238403 A1* | 10/2006 | Golan | F41G 5/08 342/62 |
| 2006/0271245 A1* | 11/2006 | Herman | F41G 7/007 701/1 |
| 2007/0190495 A1* | 8/2007 | Kendir | F41A 33/02 434/21 |
| 2007/0238073 A1* | 10/2007 | Portoghese | F41G 3/2605 434/21 |
| 2008/0127814 A1* | 6/2008 | McKendree | F41A 17/08 89/1.11 |
| 2008/0206718 A1* | 8/2008 | Jaklitsch | F41A 31/00 434/12 |
| 2009/0173788 A1* | 7/2009 | Moraites | F41G 3/04 235/411 |
| 2009/0205239 A1* | 8/2009 | Smith, III | F41G 1/38 42/122 |
| 2010/0010792 A1* | 1/2010 | Blevins | F41G 3/32 703/7 |
| 2011/0017864 A1* | 1/2011 | Roemerman | F42B 10/64 244/3.16 |
| 2012/0186130 A1* | 7/2012 | Tubb | F41G 1/38 42/122 |
| 2012/0274922 A1* | 11/2012 | Hodge | F41J 5/02 356/28 |
| 2013/0193645 A1* | 8/2013 | Kazakov | F41J 5/06 273/372 |
| 2013/0344461 A1* | 12/2013 | Tello | F41G 3/2633 434/21 |
| 2014/0110482 A1* | 4/2014 | Bay | F41G 1/38 235/404 |
| 2014/0305025 A1* | 10/2014 | Tubb | F41G 1/473 42/130 |
| 2014/0370466 A1* | 12/2014 | Axerud | F41J 5/02 434/22 |

OTHER PUBLICATIONS

Larry J. Levy, NPL, "The systems analysis, test, and evaluation of strategic systems", 2005.*
Michael P. Bailey, NPL, "Establishing Reliability Goals for Naval Major-Caliber Ammunition", 1992.*
Kevin Massey, NPL, "A system of systems design of a guided projectile mortar defense system", 2006.*
Engler et al. ("A Scenario Selection Methodology Supporting Performance Analysis of Theater Ballistic Missile Defense Engagement Coordination Concepts", Johns Hopkins APL Technical Digest, vol. 23, No. 2 and 3 (2002), pp. 260-271).*

* cited by examiner

FIG. 9B

SYSTEM AND METHOD FOR EVALUATING THE PERFORMANCE OF A WEAPON SYSTEM

GOVERNMENTAL INTEREST

The invention described herein may be manufactured and used by, or for the Government of the United States for governmental purposes without the payment of any royalties thereon.

FIELD OF THE INVENTION

The present invention relates to the field of computing devices, and more particularly relates to computing devices for modeling and analyzing the performance of a weapon system in a combat scenario.

BACKGROUND OF THE INVENTION

Traditionally, the task of evaluating the effectiveness of a weapon system in a combat engagement is performed using a two-step approach. The first step is to create an error budget for the system being analyzed, and the second step is to use that error budget to evaluate the probability of defeating a target.

An error budget is a collection of forces and effects that contribute to a fired round missing its intended aim point. These forces and effects are described through equations that calculate their downrange miss distances. The values of the results are then root-sum-squared into three categories based on how the errors manifest themselves in an scenario. These categories are round-to-round, burst-to-burst, and engagement-to-engagement. These values are then used in further analysis.

Once an error budget has been created, it is used with one of two methodologies to calculate the probability of defeating a target. These two methodologies are known as R3011 and FBAR and are generically illustrated in FIG. 1. The method used to analyze the weapon depends on the complexity of the firing situation. R3011 is a statistical approach that is used in direct fire situations with simple targets. FBAR is an iterative solution that is used in more complex scenario or with air burst munitions.

In general, the conventional solution to the problem of evaluating a weapon system has several drawbacks and/or shortcomings. One such drawback is that the equations in the error budget are only a rough estimation of the actual effect. The current error budget structure cannot handle the necessary complexity needed to describe the error source fully. This limitation results in a loss of accuracy. It also makes the traditional method inadequate for studying dynamic error sources such as erratic winds, inconsistent metrological data, and variable accuracy laser range finders. Additionally, the requirement of having to categorize each error source to one of the aforementioned three main categories mentioned leads to a loss of realism in the model. All these drawbacks create an opportunity for improvement in the error budget implementation.

Each probability of hit evaluation approach also has its drawbacks. R3011 is limited to analyzing relatively simple cases, such as direct fire on a rectangular target. If a non-rectangular target is considered, the R3011 statistical methodology becomes very complex and cannot be solved in a reasonable amount of time. Furthermore, R3011 is limited to the number of rounds that can be fired at a target.

As shown in FIG. 2, the computations become unstable between 5 and 15 rounds causing an error in the solution. FBAR tries to overcome these drawback by using Monte Carlo simulation to calculate the probability of defeating the target. While being able to handle situations that R3011 cannot, it still has its limitations. FBAR does not provide any type of situational awareness for the scenario being considered, thus making it difficult to understand what is happening in the simulation. It is also limited to three levels of randomization due to its ties to the error budget.

Errors can only be drawn for the main categories and not for individual errors. Because of this, real data cannot be used direction with the current solution to calculate the probability of hit. In addition, since FBAR is implemented in a command prompt software, it takes a skilled engineer to run the analysis and the process of optimizing a solution becomes very time consuming.

There are some system level shortcomings as well. Since the neither R3011 nor FBAR can interact with the error budget directly, it has become difficult to examine how changes in the error budget influence the performance of the weapon system. This capability is critical to optimizing a weapon system. Furthermore, the conventional solutions make it difficult for Subject Matter Experts (SMEs) to collaborate. Information about errors is traditionally held in confidence and not shared. As a result, the error budget equations becomes cryptic and difficult to use and understand. This also leads to each SME having his/her individual error budget for a particular weapon system that requires interpretation.

Therefore, a need arises for a more flexible, dynamic, and practical method for analyzing the performance of a weapon system in an engagement scenario. The need for such a modeling and simulation method has heretofore remained unsatisfied.

SUMMARY OF THE INVENTION

The present invention addresses the concerns of the conventional modeling methods and presents a new system and method for modeling and analyzing the performance of a weapon system.

The present method overcomes the shortcomings of the conventional methods, and provides additional modeling and simulation capability. Furthermore, it allows users to interact with the simulation in real time, giving them an intuitive feel for the weapon system. This feature provides real time feedback to the users, which cannot be captured by statistics alone.

Rather than displaying numbers, the present method provides a visual representation of the engagement scenario, and displays the results on a real time basis, as they transpire. Instead of representing the error budget with numbers, the present method represents the error budget with an object. As used herein, an "object" is a capsule of inputs an outputs that provides calculations in real time.

The present method can be used to identify potential areas for improvement in a weapon system, concentrate development funds where they would be most beneficial, and create doctrines for engagements. The present method is not limited to rectangular targets, and is capable of processing any kind of engagement scenarios, such as multiple targets, direct hit missions, airburst munition, etc.

Furthermore, the present method promotes collaboration between the SMEs by allowing them to share information about the error budget while protecting the confidentiality of their systems.

The present method interprets the error budget by showing how each error contributes to the final solution, and does not require a separate interpretation from skilled personnel.

To this end, the present method for evaluating the performance of a weapon system in an engagement scenario, is implemented by a system comprised of a target module that handles all target related calculations and that provides all target related data to a simulation module and to a scenario module, and a projectile module that handles all projectile related calculations and that provides all projectile related data to the simulation module and to an error budget module.

The scenario module allows a user to create the engagement scenario within which to test the weapon system, and further provides scenario information to the simulation module. The simulation module creates after-action scenarios for display to the user.

The simulation module acquires target parameters, aim points, and firing sequence from the scenario module, and target information from the target module, and further places the target within the engagement scenario. The simulation module then acquires projectile information from the projectile module and combines the projectile information with errors retrieved from the error budget module, to place simulated rounds within the engagement scenario.

The system also includes a statistic module that analyzes the engagement scenario, and a visualization module that interprets the analyzed engagement scenario for display to the user.

According to one embodiment of the present invention, the simulation module keeps engaging the target until a defined success value is achieved, and the error budget module creates an error budget, provides error samples, and calculates the effects on the projectile dynamically. The error budget module communicates with the projectile module to obtain projectile characteristic data for use in calculating error values.

The error budget module further provides data to the simulation module in order to place the simulated rounds within the engagement scenario, and the statistics module calculates user selected statistics from a complete engagement scenario that was created by the simulation module.

The visualization module creates images from the complete engagement scenario created by the simulation module and displays them to the user, for enabling the user to interact with the engagement scenario, in order to obtain further information about objects in the engagement scenario.

Additional aspects of the present invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein:

FIG. 9A and FIG. 9B are screen shots illustrating a firing scenario setup generated by the scenario module of FIG. 3;

The objects, graphs, and graphics within the screen shots are designated by numeral references that are followed by the letter "A" to correlate the modules or elements bearing the same numeral references and that are respectively associated with such objects, graphs, and graphics.

DETAILED DESCRIPTION OF PREFERRED EMBODIMENTS

Figure 1:
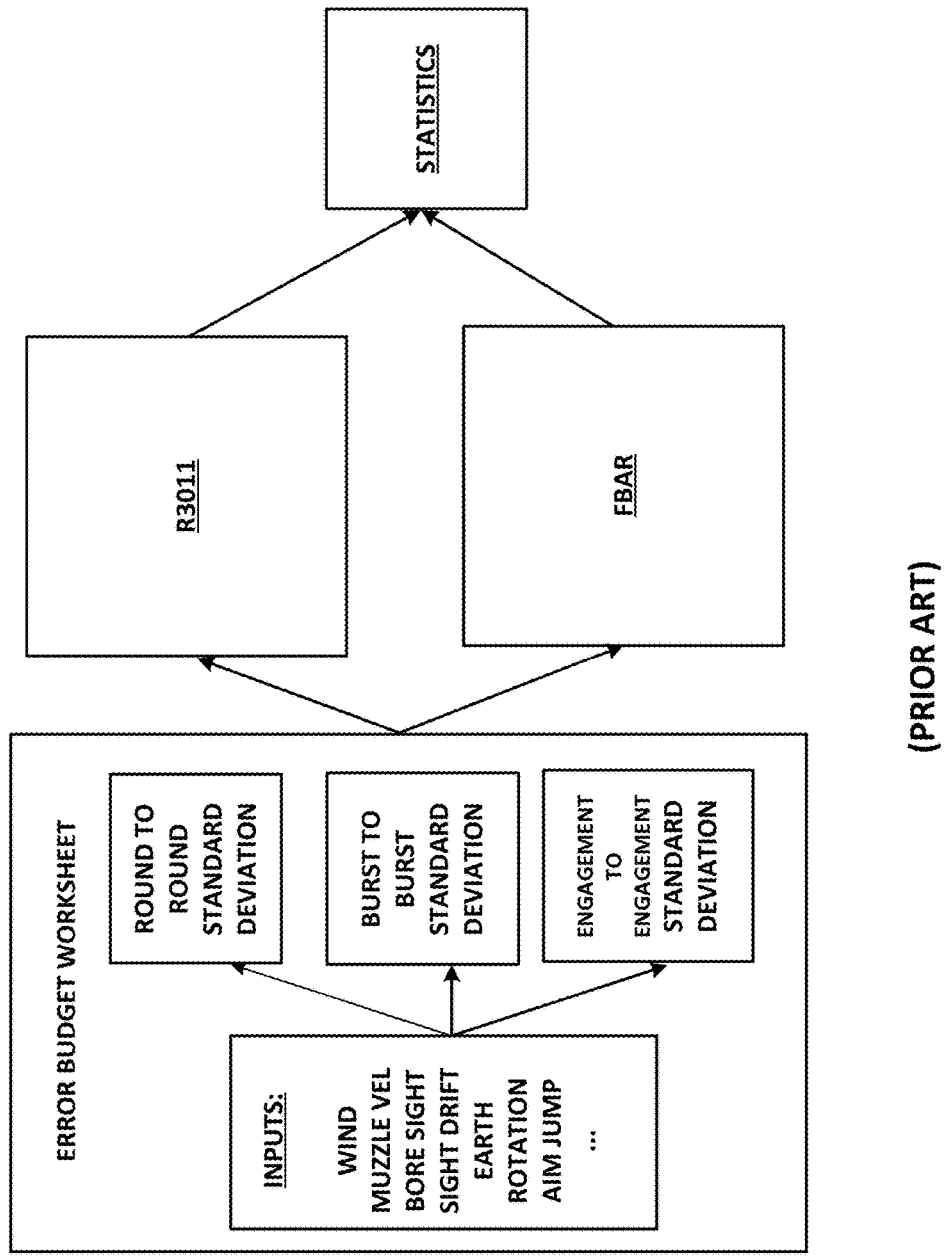
FIG. 1 is a block diagram that illustrates a conventional architecture of a system for analyzing the performance of a weapon system.
Figure 2:
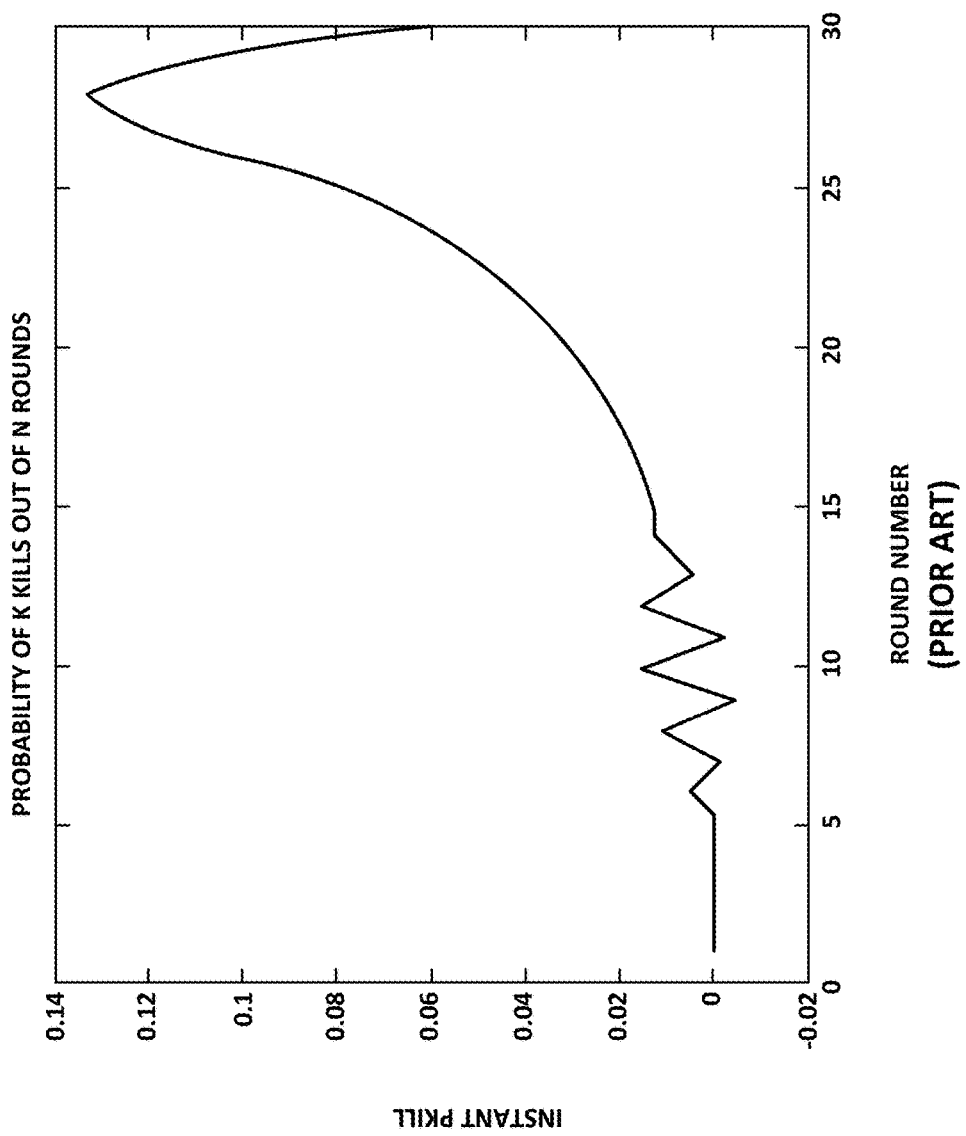
FIG. 2 is an exemplary graph that illustrates the breakdown of the conventional system of FIG. 1 upon reaching a threshold round number.
Figure 3:
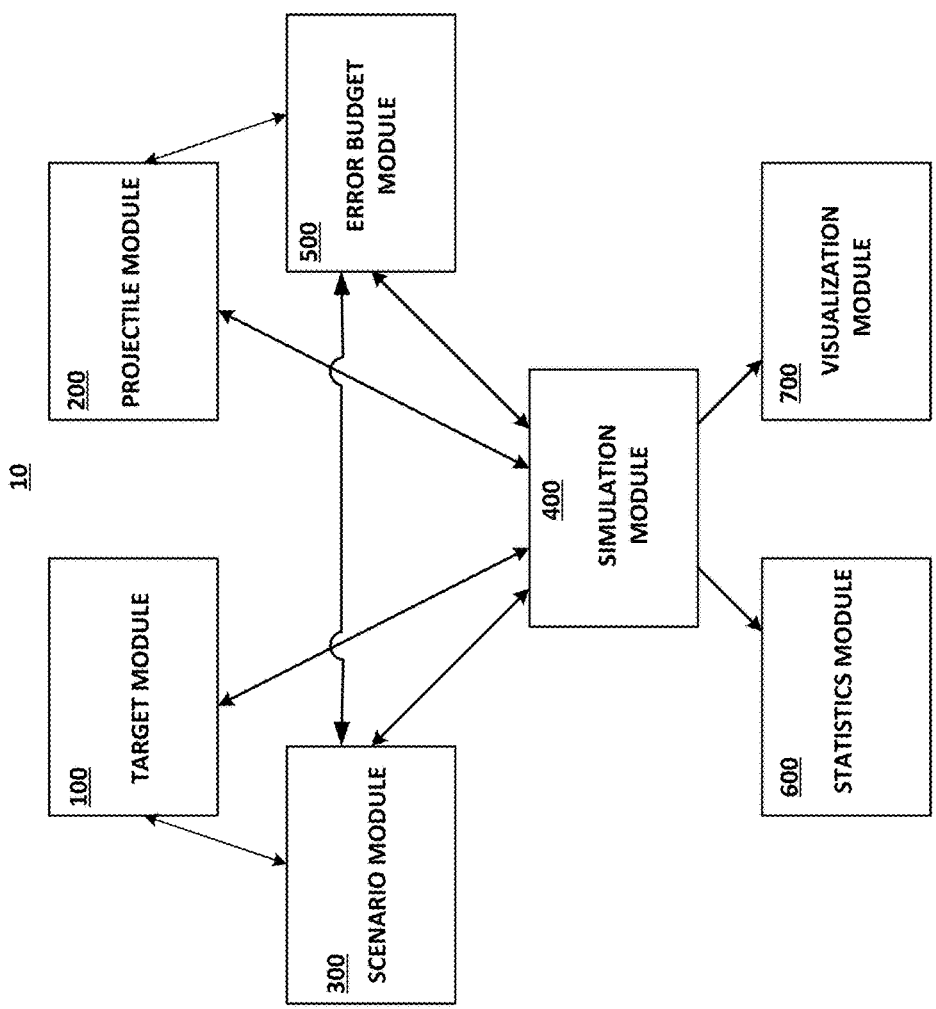
FIG. 3 is a block diagram that illustrates a high level architecture of a modeling and simulation system for modeling and analyzing the performance of a weapon system according to a preferred embodiment of the present invention.

The present invention provides a system and associated method (collectively referred to herein as "the method," "the system," "the tool," "the computer program product," or "the modeling and simulation system") 10 for modeling and analyzing the performance of a weapon system. FIG. 3 illustrates a high level architecture of the modeling and simulation system 10 according to a preferred embodiment of the present invention.

The system 10 generally includes the following interconnected modules that operate on a computer or processor: a target module 100, a projectile module 200, a scenario module 300, a simulation module 400, an error budget module 500, a statistics module 600, and a visualization module 700.

In general, the target module 100 handles all target related calculations. It provides all target related data to the simulation module 400 and the scenario module 300.

The projectile module 200 handles all projectile related calculations. It provides all projectile related data to the simulation module 400 and the error budget module 500.

The scenario module 300 allows the user to create a scenario within which to test the weapon system, and it further provides the scenario information to the simulation module 400.

The simulation module 400 creates after-action scenarios that can be analyzed or displayed to the user. The simulation module 400 acquires the target parameters, aim points, and firing sequence from the scenario module 300. It also acquires the target information from the target module 100 and places the targets in the scene. It then acquires the projectile information from the projectile module 200 and combines this projectile information with the errors retrieved from the error budget module 500, to place the rounds in the scene.

This complete scene can then be analyzed by the statistics module 600 or interpreted by the visualization module 700 and displayed to the user. The simulation module 400 keeps executing until the user defined goal is achieved. As an example, the user-defined goal can be to simulate a predetermined number of engagements, keep engaging the target until a defined success value is achieved, or a combination of the two.

The error budget module 500 creates an error budget, provides error samples, and calculates the effects on the projectile dynamically. It communicates with the projectile module 300 to obtain projectile characteristic data for its calculations. It also provides its data to the simulation module 400.

The statistics module 600 calculates user selected statistics from the complete scenes created by the simulation module 400.

The visualization module 700 creates images from the complete scenes created by the simulation module 400 and displays them for the user. The user can interact with the scene to obtain further information about objects in the engagement.

Figure 4:
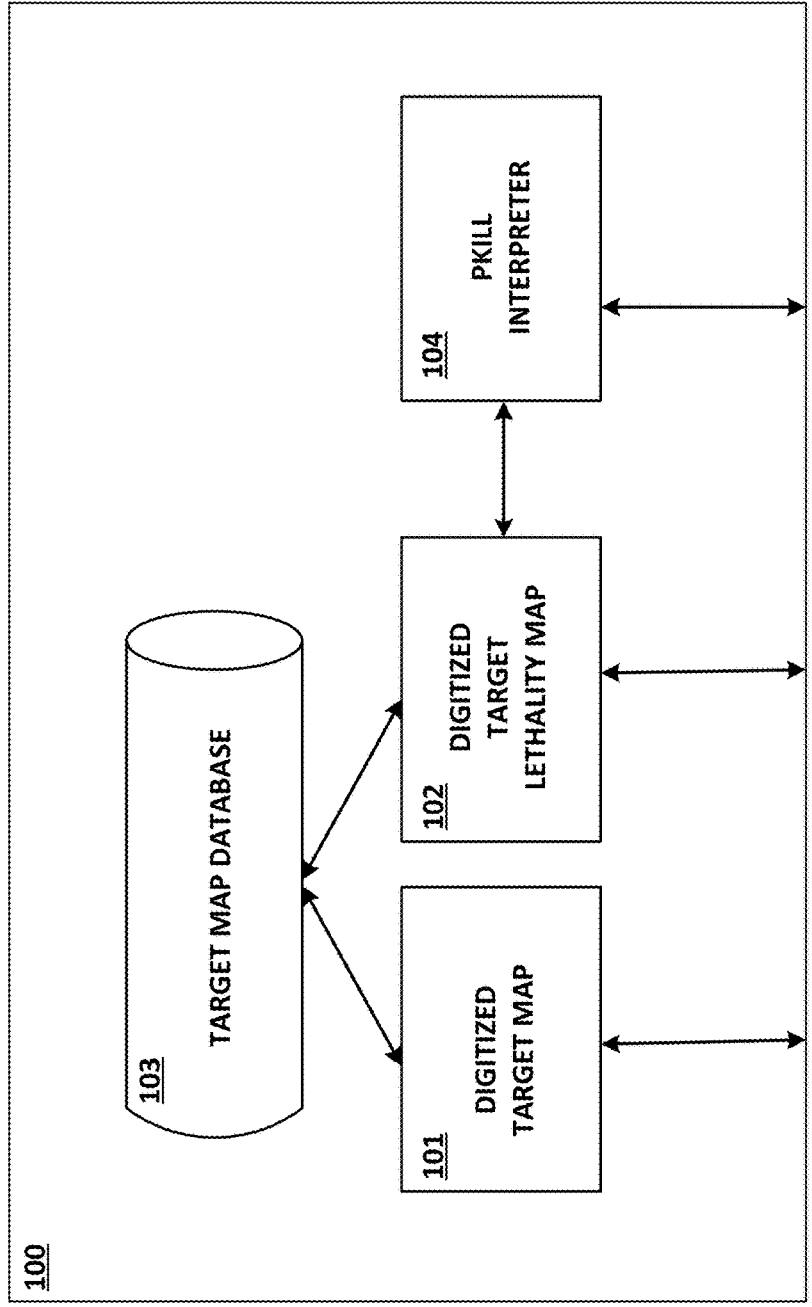
FIG. 4 is a more detailed block diagram of a target module that forms part of the modeling and simulation system of FIG. 3.
Figure 5:
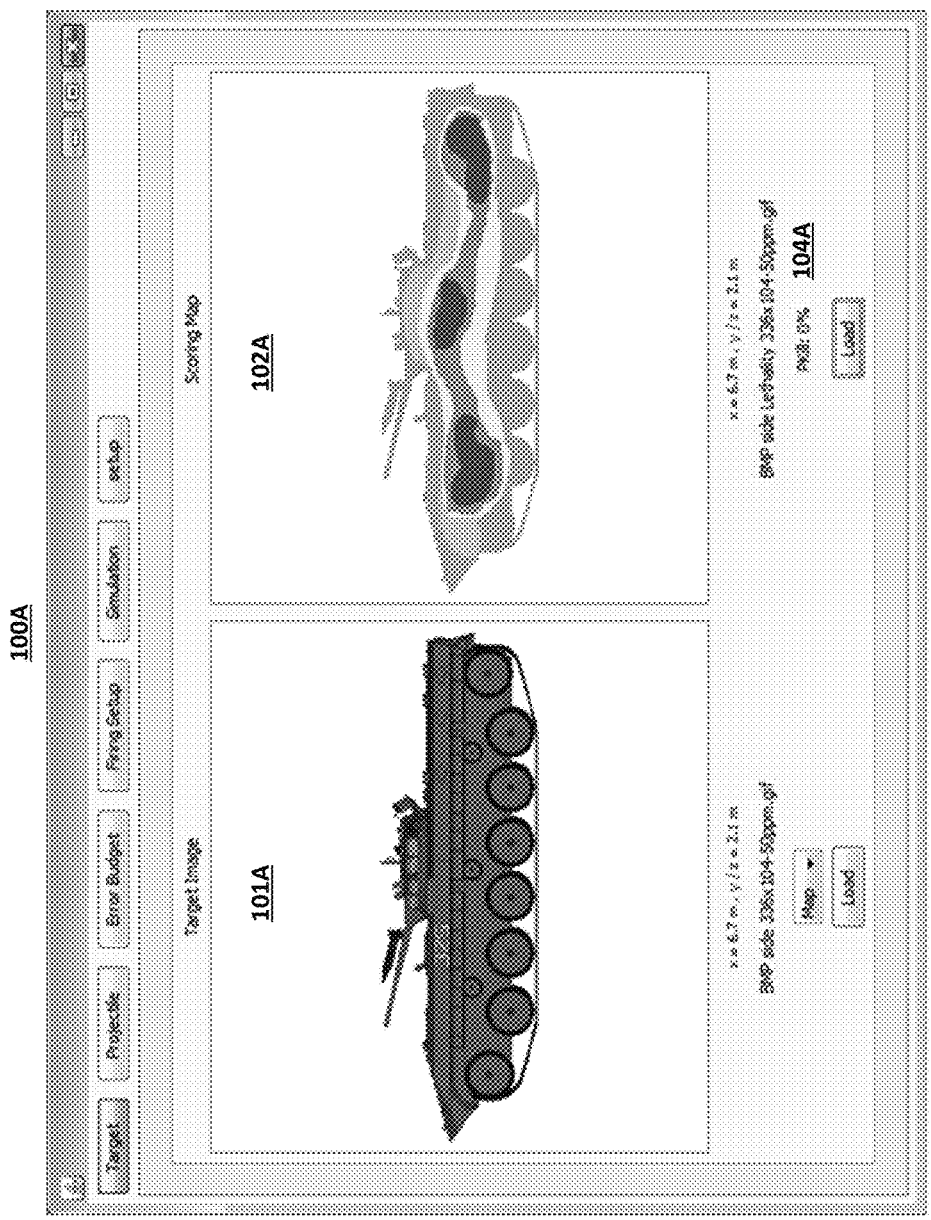
FIG. 5 is a screen shot illustration of a target image and a scoring map generated by the target module of FIG. 4.

The following is a more detailed description of the various modules of the system 10. With reference to FIGS. 4 and 5, the target module 100 includes a digitized target map 101, a digitized target lethality map 102, a target map database 103, and a PKill interpreter 104. The target module 100 serves as a data capsule and communications manager for all data related to the target. The target module 100 provides its data and the analysis mode chosen by the user to the simulation module 400 and scenario module 300.

The digitized target map 101 creates a target image for the specific target chosen by the user from the target database 103. It retrieves the target information, translates this information into a visual representation, calculates the relative target dimensions, and then displays the results to the user. The digitized target map 101 then provides this information to the target module 100 upon request by the simulation module 400 or scenario module 300.

The digitized target lethality map 102 creates a target vulnerability map for the specific target chosen by the user from the target database 103. It retrieves the map information, interprets the probably of kill values, translates these kill values into a visual representation, calculates the relative target dimensions, and displays the results to the user. The digitized target lethality map 102 then provides the lethality map upon request to the simulation module 400.

The images created by the digitized target map 101 are used when setting up a firing scenario in the scenario module 300 and upon displaying a scene to the user in the visualization module 700. The images created by the digitized target lethality map 102 are used by the simulation module 400 to create a specific engagement scenario and by the statistics module 600 to analyze the scenario.

The target map database 103 is a data capsule for holding target maps and vulnerability maps. It provides this data to modules 101 and 102 upon request by the user.

The PKill interpreter 104 provides the probability of defeating the target based on a specific point on the vulnerability map. It decodes the information encoded into the map, calculates the probably of kill, and provides this information to the user or the simulation area, upon request by either entity.

FIG. 5 is an example implementation of the target module 100. The reference numerals in this example correspond to those in FIG. 4.

Figure 6:
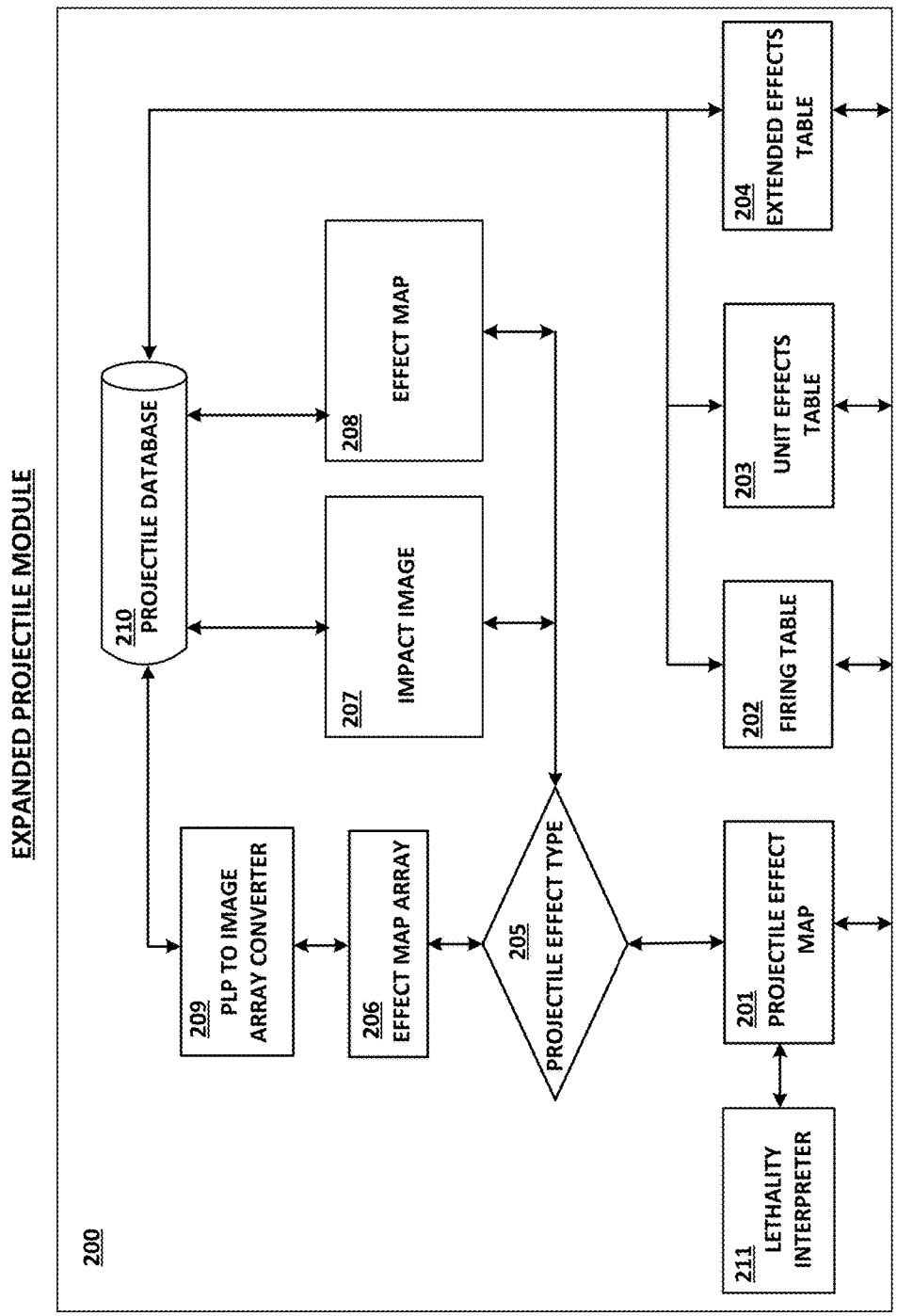
FIG. 6 is a more detailed block diagram of a projectile module that forms part of the modeling and simulation system of FIG. 3.
Figure 7A:
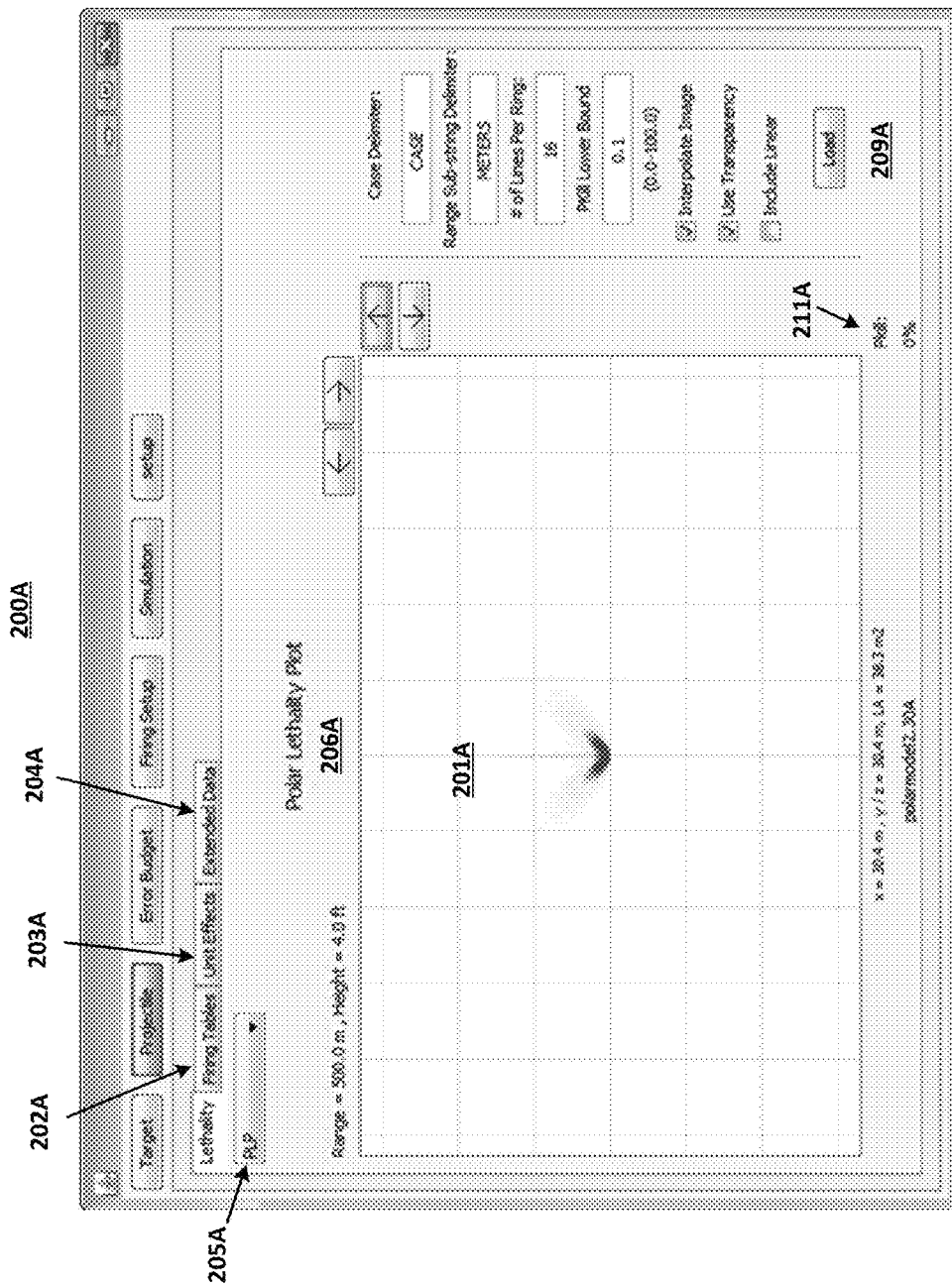
FIG. 7A and FIG. 7B are screen shots illustrating a projectile effectiveness image generated by the target module of FIG. 4.
Figure 7B:
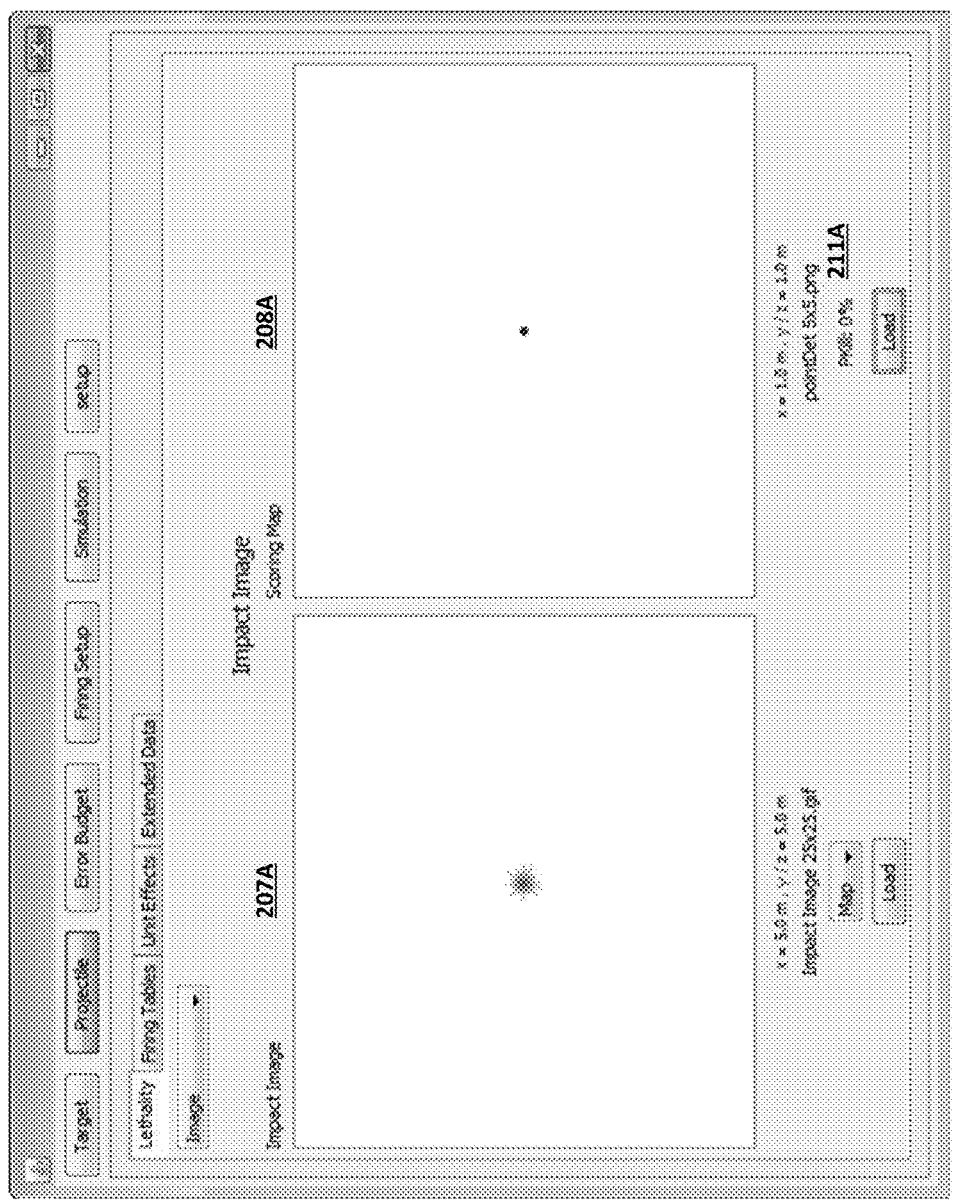

With reference to FIGS. 6, 7A, and 7B, the projectile module 200 includes a projectile effects map 201, a firing tables 202, a unit effects table 203, a extended data table 204, projectile effect type switch 205, digitized effect map array 206, impact image 207, effect map 208, PLP to image array creator 209, and a projectile database 210.

The projectile module 200 serves as a data capsule and communications manager for all data related to the projectile. The projectile module 200 further provides its data and the analysis mode chosen by the user to the simulation module 400 and error budget module 500.

The projectile effect map 201 holds an impact image, effect map, and an analysis mode for a user selected projectile and effect type. This data is either provided by the effect map array 206 or by the impact image 207 and effect map 208 modules, depending on the choice made by the user in the projectile effect type selection 205.

This data is provided to the simulation module 400 upon request. Each time the simulation module creates an impact, the data for that impact is provided by this module.

The firing table 202 holds the firing table data loaded from the projectile database 210 for a user specified projectile. It provides this data to the error budget module 500.

The unit effects table 203 holds the unit effects data loaded from the projectile database 210 for a user specified projectile. It provides this data to the error budget module 500.

The extended data table 204 holds the additional projectile data loaded from the projectile database 210 for a user specified projectile. It provides this data to the error budget module 500.

The projectile effect type selection 205 lets users select the type of effect map to use in the simulation, visualization, and statistics modules 400, 600, 700. Depending on which selection is made, either the effect map array 206 will be provided to the projectile effect map 201 or the impact image 207 and effect map 208 will be made available.

The effect map array 206 is an array that holds lethality images for all combinations of range and height that are relative to the engagement. This module includes a display that shows a single image for a selected range and height to the user. The user is also able to use this display to move through the array in real time while observing the effects on the lethality plot. This allows the user to see the evolution of the lethality plot with respect to range and height. Individual images are provided to the projectile effect map 201 upon request.

The PLP to image array converter 209 creates a lethality image array for a user selected Polar Lethality Plot (PLP) file. For each combination of range and height in the PLP data file, this module creates an image based on the data, then encodes the lethality values into the image. It does this for all available range and height values. If needed, it interpolates between images to create the full array. The PLP data is retrieved from the projectile database 210 and the full array is provided to the effect map array 206.

The impact image 207 creates a impact image for the specific impact chosen by the user from the projectile database 210. It provides this information to the projectile effect map 201.

The effect map 208 creates a lethality image for the effect map chosen by the user from the projectile database 210. This module translates the lethality information into a visual representation and provides this information to the projectile effect map 201.

The projectile database 210 holds any information related to the projectile and its effects. It provides this data to the firing table 202, unit effect table 203, extended effects table 204, impact image 207, effect map 208, and PLP to image array converter 209.

The lethality interpreter 211 provides the lethality of a given round against a specific target based on a specific point on the projectile effect map 201. It decodes the information encoded into the map, calculates the lethality, and provides this information to the user upon request.

FIGS. 7A and 7B are exemplary implementations of the projectile module 200. The image presented within illustrates the module as a whole as well as multiple examples of implemented sub modules.

Figure 8:
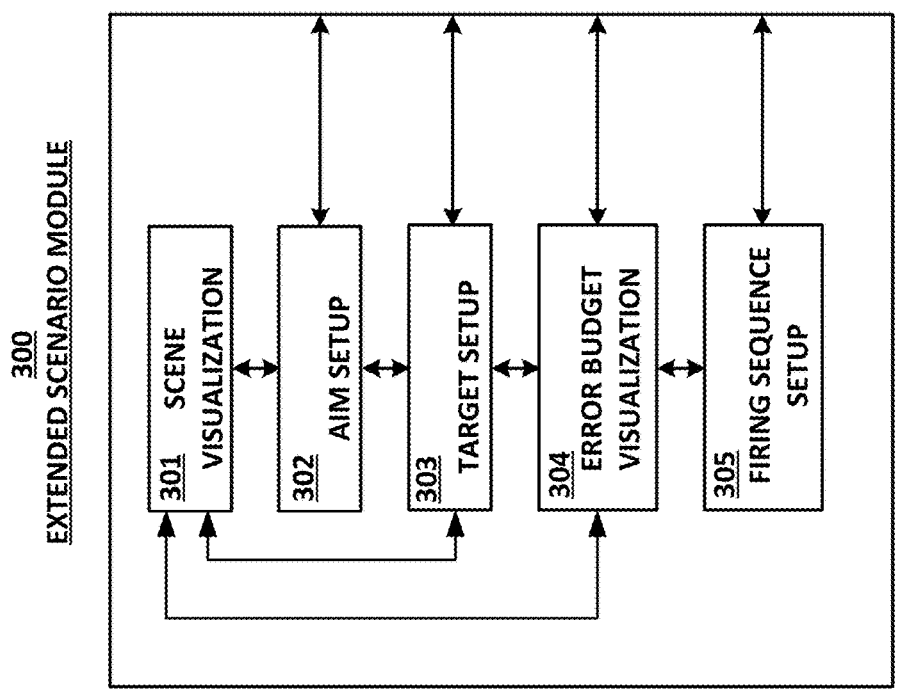
FIG. 8 is a more detailed block diagram of a scenario module that forms part of the modeling and simulation system of FIG. 3.
Figure 9A:
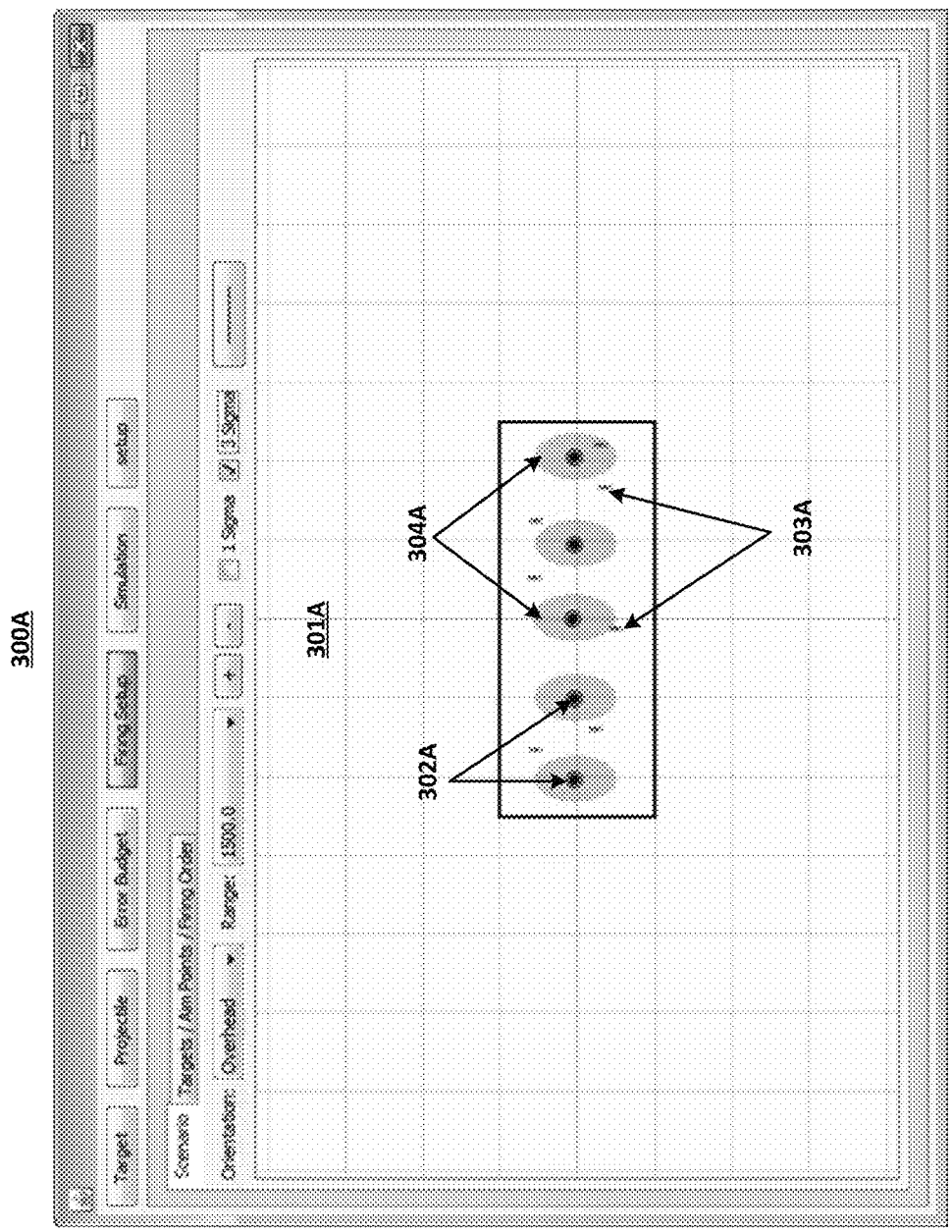
Figure 9B:
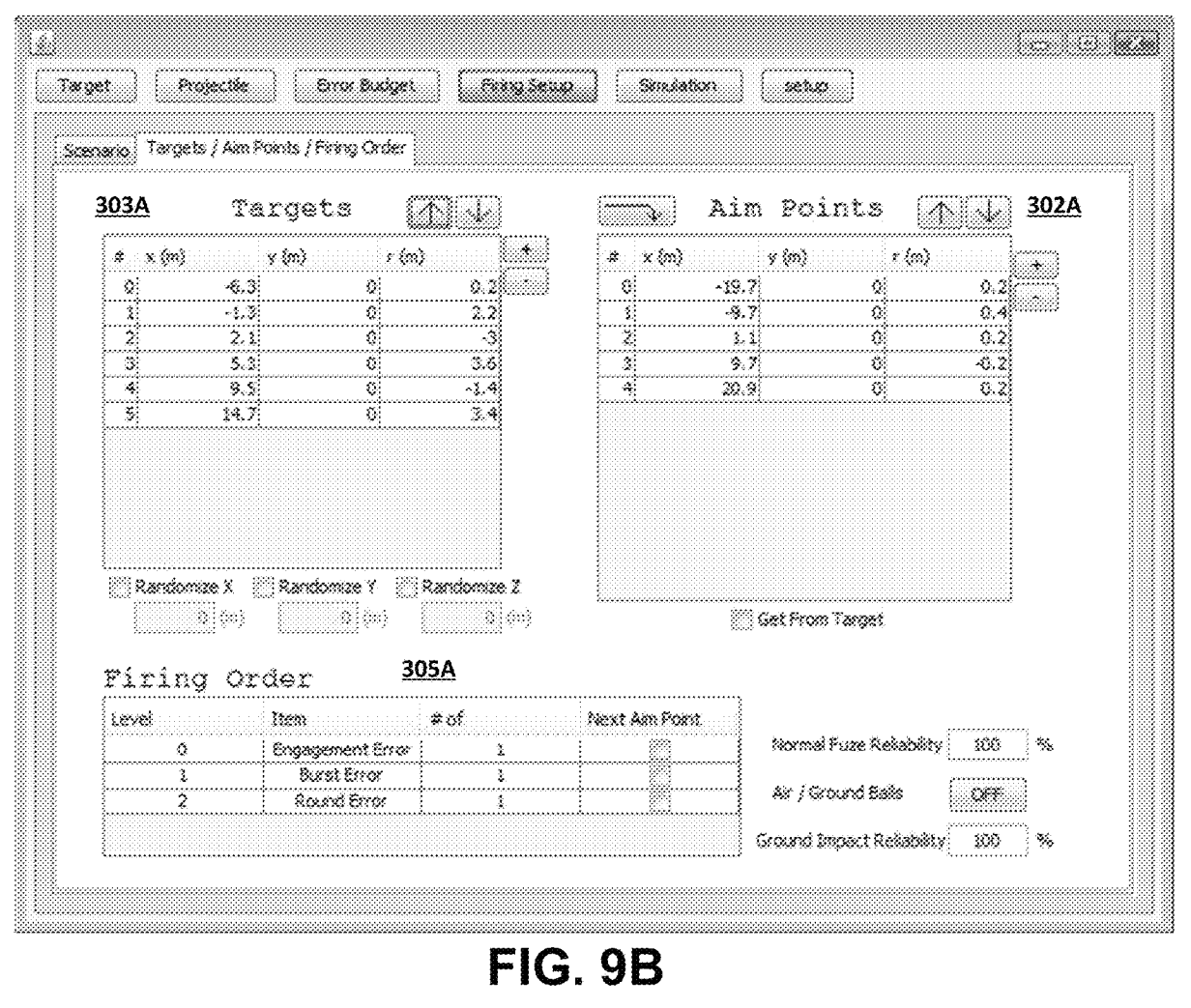

With reference to FIGS. 8, 9A, and 9B, the scenario module 300 includes the following sub modules: scene visualization module 301, aim setup module 302, target setup module 303, error budget visualization module 304, and firing sequence setup module 305.

The scenario module 300 serves as a data capsule and communications manager for all the data related to the engagement scenario. It provides its data to the simulation module 400.

The scene visualization module 301 displays the engagement scenario to the user and lets the user place aim points or targets in the scene. It exchanges information about aim points with the aim setup module 302 and about targets with the target setup module 303. It gets error budget information from the error budget visualization module 304 and draws them over the aim point to show the user where the projectile is likely to land in the scene.

The aim setup module 302 lets the user place aim points in the scene and describes how the simulation module will use the aim points. The aim points can be placed in a specific location in space or they can follow targets. This module provides the aim point coordinates to the simulation module 400 and the scene visualization module 301.

The target setup module 303 lets the user place targets in the scene and specify the random motion of the targets. This information is provided to the simulation module 400, scene visualization module 301, and aim setup module 302.

The error budget visualization module 304 retrieves error budget information from the error budget module 500 and draws it in the scene created by the scene visualization module 301. This allows users to see where the projectiles are likely to land in the scene and how likely they are to hit the target. The error budget visualization module 304 also lets the users compare error budgets by concurrently displaying multiple error budgets.

The firing sequence setup module 305 allows the user to describe how to fire projectile in the engagement. The user can specify how to group the projectiles and what quantity of each group is to be fired at an aim point. This module communicates with the error budget module 500 to obtain top level container information that is used to create the groups of projectiles. The firing sequence is passed to the simulation module 400.

FIGS. 9A and 9B are exemplary implementations of the scenario module 300. The images presented within illustrates the module as a whole as well as multiple examples of implemented sub-modules.

Figure 10:
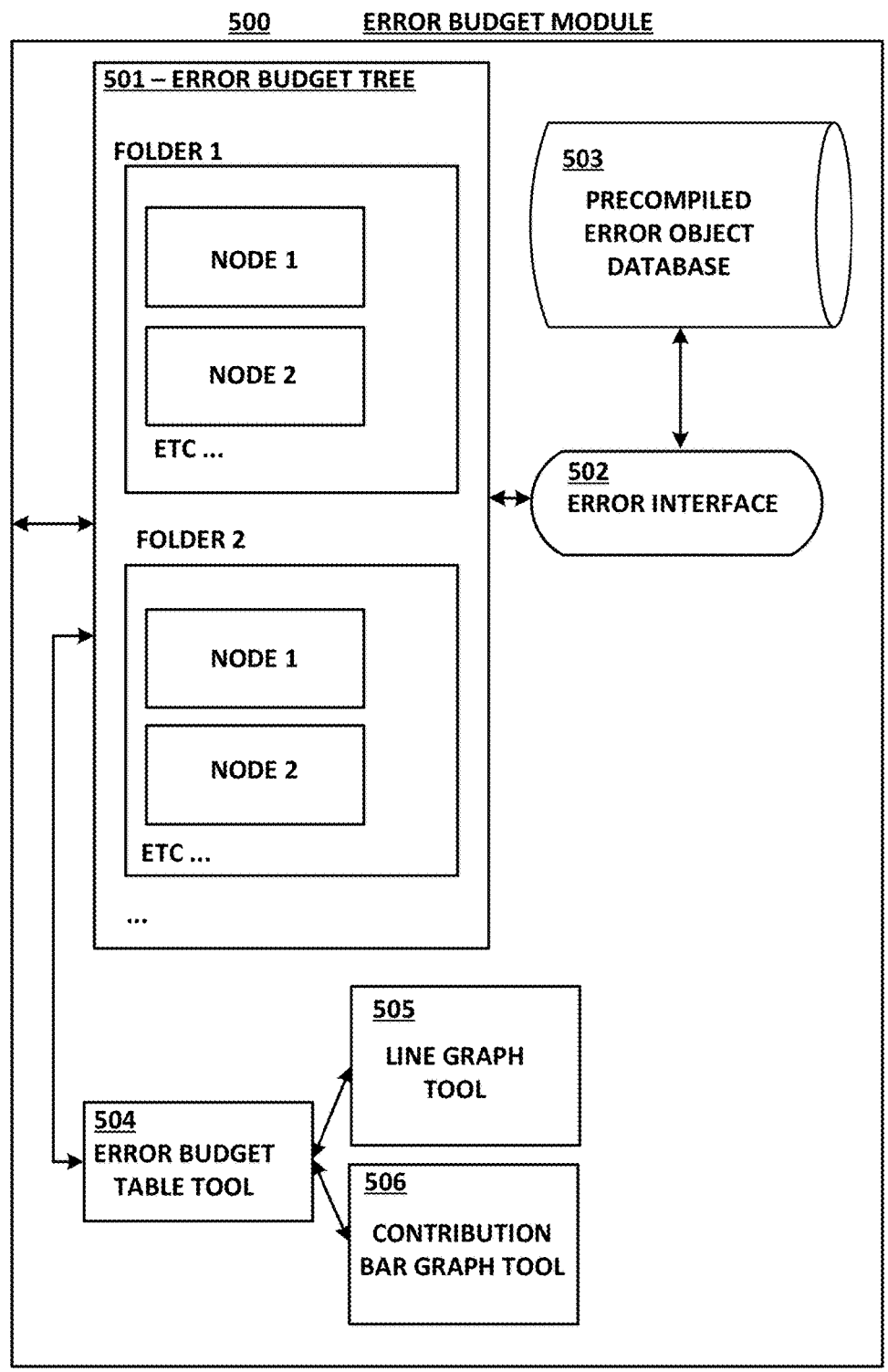
FIG. 10 is a more detailed block diagram of an error budget module that forms part of the modeling and simulation system of FIG. 3.
Figure 11A:
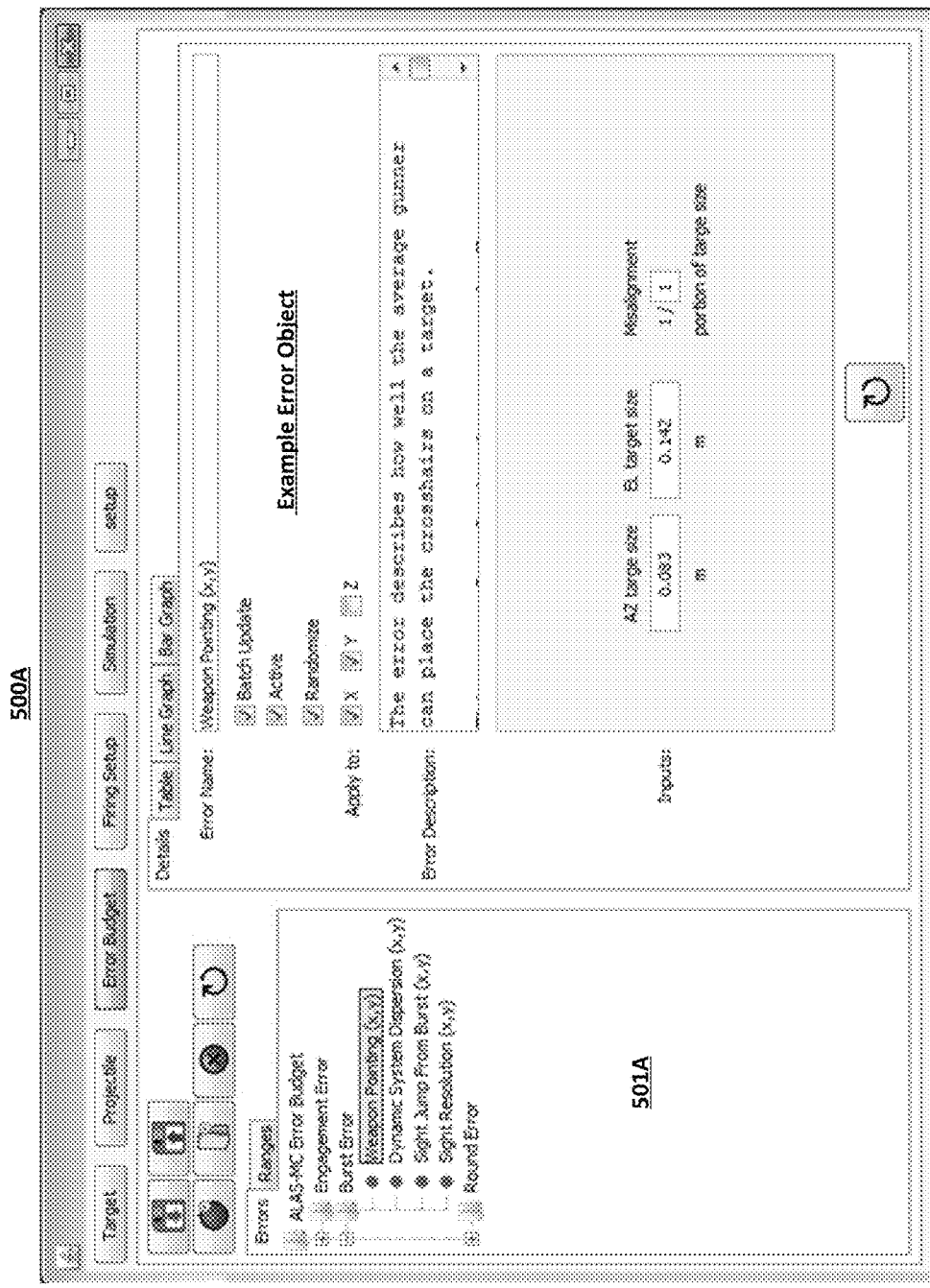
FIGS. 11A, 11B, 11C, and 11D are screen shots illustrating an error budget structure generated by the error budget module of FIG. 4.
Figure 11C:
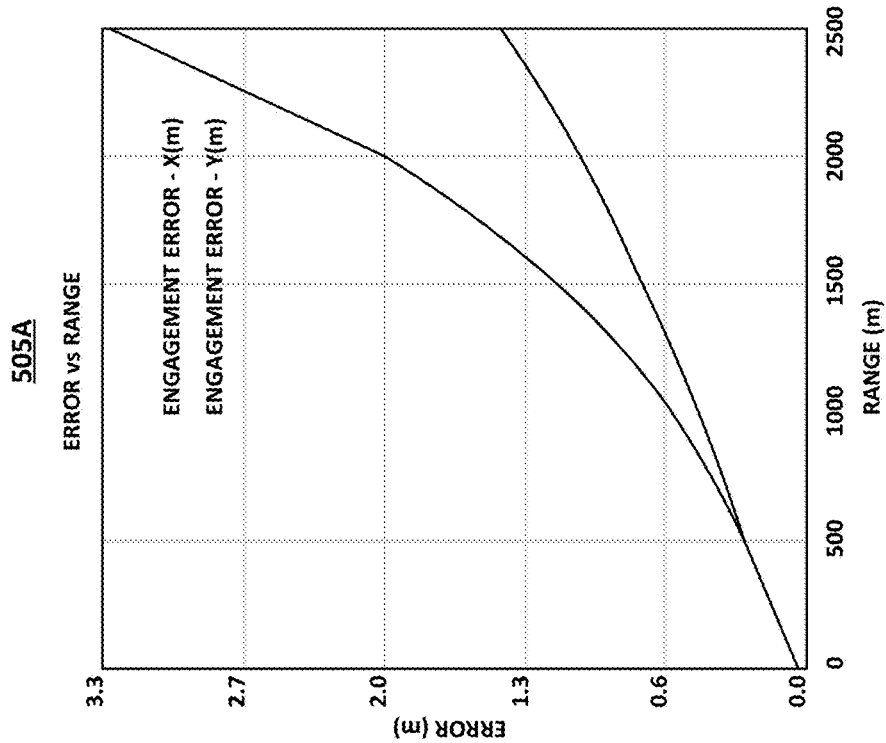
Figure 11B:
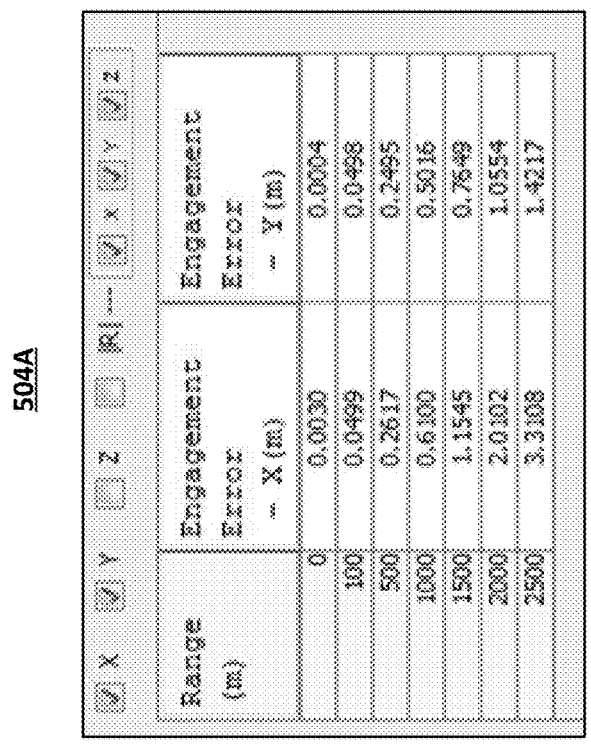
Figure 11D:
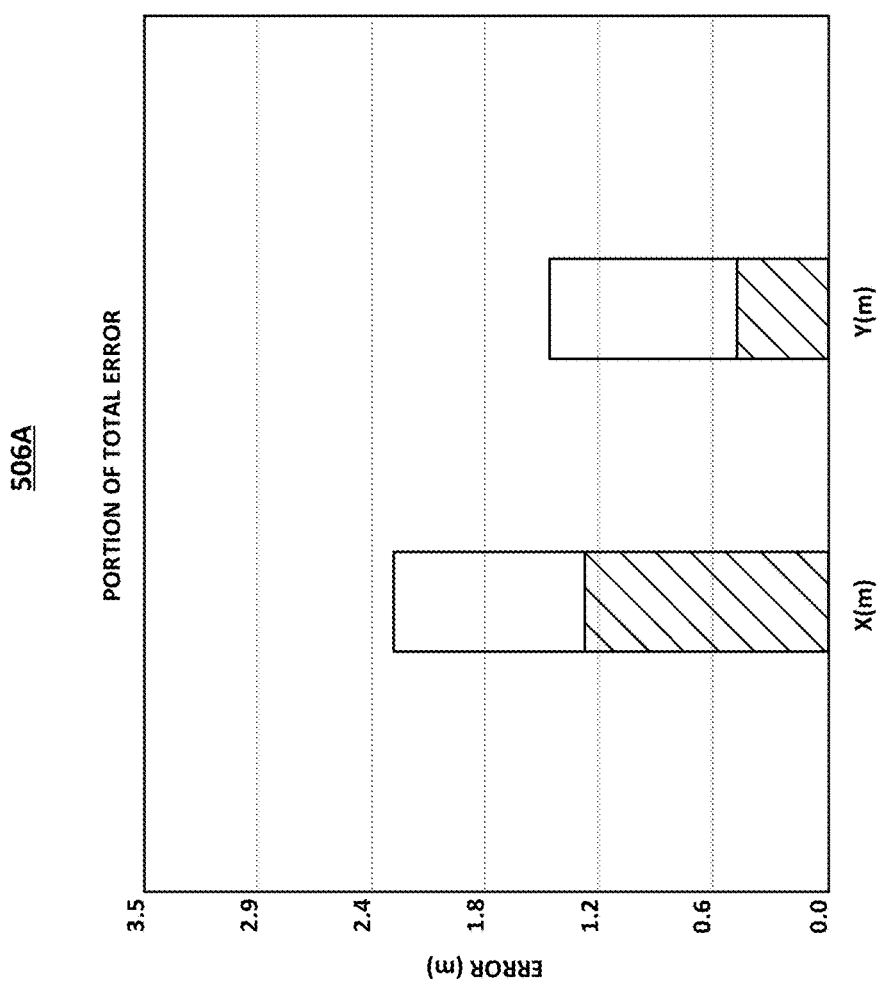

With reference to FIGS. 10 and 11, the error budget module 500 includes an error budget tree 501, an error interface 502, a precompiled error object database 503, an error budget tools module 504, a table tool 505, a line graph tool 506, and a contribution bar graph tool 507.

The error budget module 500 serves as a data capsule and communications manager for all data related to the error budget. It provides its data to the simulation module 400 and the scenario module 300.

The error budget tree 501 is an interactive tool that communicates with the user to create an error budget and with other modules of the system 10 to provide the error budget data on demand. The error budget is structured as a hierarchical tree composed of folders and nodes. A folder is a grouping of nodes and each node is an instantiated error object. Error objects are dynamic black box entities that takes a set of inputs and returns error values.

At each level of the error budget tree 501, the user can specify if the errors should be constant, randomized, or sub sampled. If the errors are constant, then the same value is returned for every sample. Randomized error values return a normally distributed random error value that is the result of the nodes within the folder. If the folder is specified to be sub-sampled, each error in the folder is calculated and sampled at every request. This is necessary for errors that cannot be accurately described by normal distribution or errors that return real world data samples form a data set.

The error budget tree 501 communicates with the projectile module 200 to obtain data needed for error calculations. It provides top level container values to the scenario module 300, and error values to the simulation module 400.

Specifying error objects to be black boxes allows the users to share and to use error objects without revealing how they are implemented, thus protecting proprietary methodologies. Communication between the error objects and the error budget tree 501 is done through the error interface 502, which guarantees that each error object can perform a predetermined set of communication functions.

The error object database 503 holds precompiled error objects. It provides the user selected error objects to the error budget tree 501.

The error budget table tool 504 retrieves error budget data for the selected (single or multiple) entities in the error budget tree 501. The values are presented in a tabular format.

The line graph tool 505 retrieves error data from the error budget table tool 504 and creates line graphs representing the data. The graphs are displayed for the user and are used to illustrate trends.

The contribution bar graph tool 506 retrieves error data from the error budget table tool 504 and creates bar graphs to show how the selected errors contribute to the overall error budget. It displays these bar graphs to the user.

FIGS. 11A, 11B, 11C, and 11D are exemplary implementations of the error budget module 500. The images presented within illustrates this module as a whole as well as multiple examples of implemented sub-modules.

Figure 12:
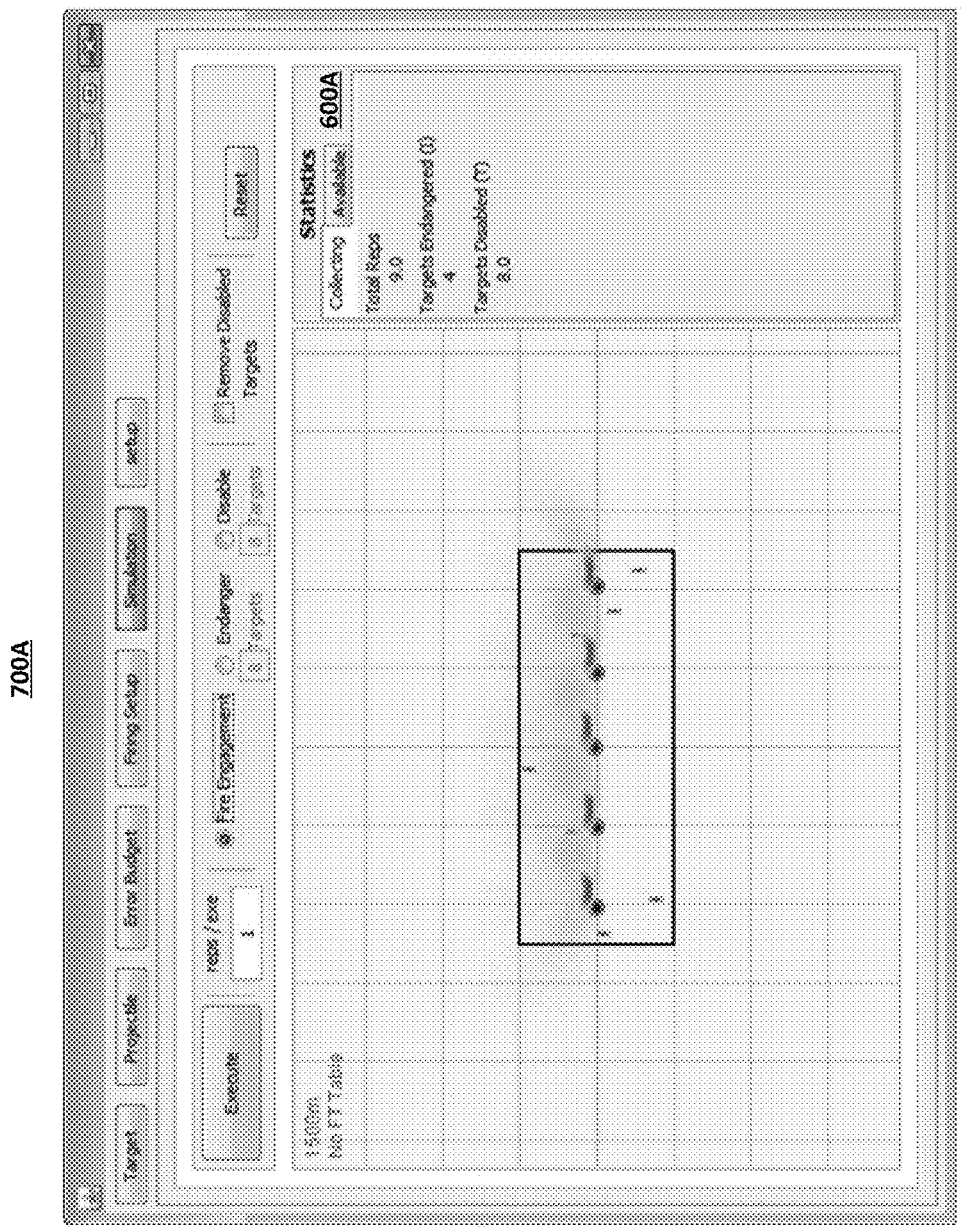
FIG. 12 is a screen shot illustration of a simulation area image generated by the visualization module and statistics generated by the statics module of FIG. 3.

FIG. 12 is an example of a engagement scenario created by the simulation module 400. The image presented is created by the visualization module 700, and the statistics presented within are calculated by the statics module 600.

Figure 13:
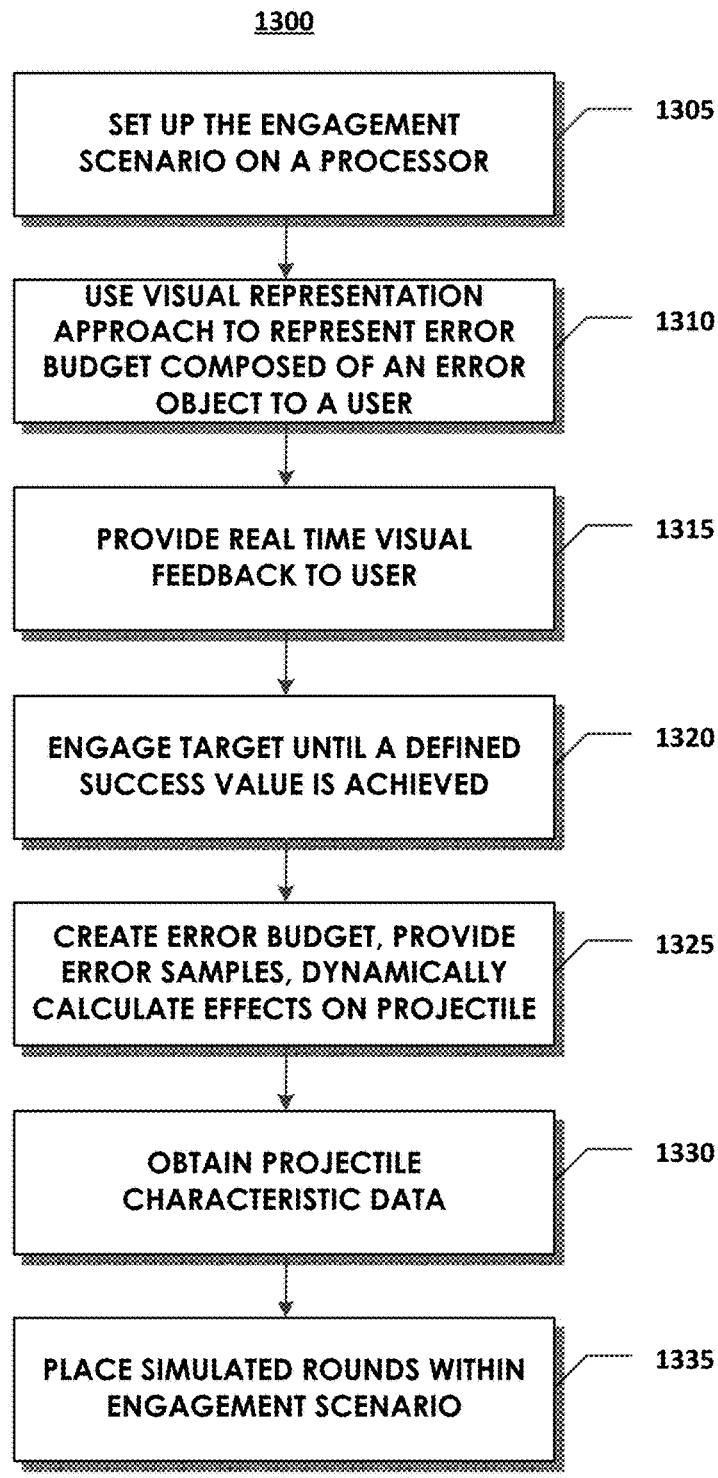
FIG. 13 is a flow chart that illustrates a method, implemented by the simulation system of FIGS. 3 through 12, for evaluating the performance of the weapon system in an engagement scenario, according to the present invention.

FIG. 13 illustrates a method 1300 for evaluating the performance of the weapon system in an engagement scenario, according to the present invention. At step 1305, a user sets up the engagement scenario on a processor.

At step 1310, method 1300 uses a visual representation approach to capture the lethality of an ammunition, the vulnerability of a target, and the results of the engagement scenario. In a preferred embodiment, step 1310 of using the visual representation approach includes visually representing an error budget composed of an error object to a user.

At step 1315, method 1300 provides real time visual feedback to the user.

At step 1320, method 1300 repeats the engagement of the target until a defined success value is achieved. At step 1325, method 1300 creates an error budget, provides error samples, and dynamically calculates the effects on the projectile.

At step 1330, method 1300 obtains projectile characteristic data for use in calculating the error values. At step 1335, method 1335, further places the simulated rounds within the engagement scenario, and calculates user selected statistics from a complete engagement scenario.

Embodiments of the present invention can take the form of an entirely hardware embodiment or an embodiment containing both hardware and software elements. In a preferred embodiment, the invention is implemented in hardware. For the purposes of this description, a computer-usable or computer readable medium can be any apparatus that can contain, store, communicate, propagate, or transport the program for use by or in connection with the instruction execution system, apparatus, or device, including but not limited to smart phones.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

What is claimed is:

1. A method for evaluating the performance of a weapon system in an engagement scenario, comprising:
   setting up the engagement scenario on a processor;
   using a visual representation approach to capture the lethality of an ammunition by displaying an effect map array, an impact image, an effect map wherein one or more projectile lethality values are encoded on the effect map array and the effect map, the vulnerability of a target type by displaying a target vulnerability map for a specific target type chosen by a user wherein one or more probability of kill values are visually encoded on the target vulnerability map, and the results of the engagement scenario by displaying one or more aim points, one or more target locations, one or more lethality plots and statistics comprising a value of total repetitions, a value of targets endangered and a value of targets disabled;
   providing real time visual feedback to a user; and
   wherein using the visual representation approach further includes visually representing an error budget composed of an error object to a user.

2. The method according to claim 1, further comprising engaging the target until a defined success value is achieved.

3. The method according to claim 1, further comprising creating an error budget, providing error samples, and dynamically calculating the effects on a projectile.

4. The method according to claim 3, further comprising obtaining projectile characteristic data for use in calculating error values.

5. The method according to claim 4, further comprising placing simulated rounds within the engagement scenario.

6. The method according to claim 1, further comprising calculating user selected statistics from a complete engagement scenario.

7. A computer program product comprised of a plurality of instructions codes on a non-transitory computer readable medium, for evaluating the performance of a weapon system in an engagement scenario, comprising:
   a first set of instruction codes for setting up the engagement scenario on a processor;
   a second set of instruction codes for using a visual representation approach to capture the lethality of an ammunition by displaying an effect map array, an impact image, an effect map wherein one or more projectile lethality values are encoded on the effect map array and the effect map, the vulnerability of a target type by displaying a target vulnerability map for a specific target type chosen by a user wherein one or more probability of kill values are visually encoded on the target vulnerability map, and the results of the engagement scenario by displaying one or more aim points, one or more target locations, one or more lethality plots and statistics comprising a value of total repetitions, a value of targets endangered and a value of targets disabled;
   a third set of instruction codes for providing real time visual feedback to a user; and
   wherein the second set of instruction codes for using the visual representation approach further includes visually representing an error budget composed of an error object to a user.

* * * * *